(12) United States Patent
Hullinger et al.

(10) Patent No.: US 8,314,468 B2
(45) Date of Patent: Nov. 20, 2012

(54) VARIABLE RING WIDTH SDD

(75) Inventors: Derek Hullinger, Orem, UT (US);
Hideharu Matsuura, Osaka (JP);
Kazuo Taniguchi, Osaka-fu (JP);
Tadashi Utaka, Osaka (JP)

(73) Assignee: Moxtek, Inc., Orem, UT (US)

( * ) Notice: Subject to any disclaimer, the term of this patent is extended or adjusted under 35 U.S.C. 154(b) by 338 days.

(21) Appl. No.: 12/617,313

(22) Filed: Nov. 12, 2009

(65) Prior Publication Data

US 2010/0314706 A1  Dec. 16, 2010

Related U.S. Application Data

(63) Continuation-in-part of application No. 12/575,939, filed on Oct. 8, 2009, now abandoned.

(60) Provisional application No. 61/185,754, filed on Jun. 10, 2009, provisional application No. 61/185,679, filed on Jun. 10, 2009.

(30) Foreign Application Priority Data

Jul. 2, 2009  (JP) ................. 2009-157627

(51) Int. Cl.
*H01L 31/115* (2006.01)
(52) U.S. Cl. .......... 257/428; 257/459; 257/E31.092; 257/E31.086; 250/370.14
(58) Field of Classification Search .......... 257/228, 257/428, 429, 430, 452, 409, 459, 431, E31.092, 257/E31.086, E31.087, 466, 457; 250/370.09, 250/370.14
See application file for complete search history.

(56) References Cited

U.S. PATENT DOCUMENTS

| 4,879,466 | A | * | 11/1989 | Kitaguchi et al. ....... 250/370.14 |
| 5,051,801 | A | | 9/1991 | Van Eijk et al. |
| 6,249,033 | B1 | | 6/2001 | Castoldi et al. |
| 6,421,414 | B1 | * | 7/2002 | Huber .............. 378/45 |
| 6,426,993 | B1 | | 7/2002 | Satoh |
| 7,105,827 | B2 | | 9/2006 | Lechner et al. |
| 7,238,949 | B2 | | 7/2007 | Struder et al. |
| 2005/0173733 | A1 | * | 8/2005 | Struder et al. ............ 257/202 |
| 2007/0072332 | A1 | | 3/2007 | Kemmer |

(Continued)

FOREIGN PATENT DOCUMENTS

JP  H02-297977  12/1990
(Continued)

OTHER PUBLICATIONS

"Silicon drift detectors for high resolution room temperature x-ray spectroscopy"; Lechner et al., Nuclear Instruments & methods in Physics Reasearch A377 (1996), 346-354.

(Continued)

*Primary Examiner* — Calvin Lee
*Assistant Examiner* — Scott Stowe
(74) *Attorney, Agent, or Firm* — Thorpe North & Western LLP

(57) ABSTRACT

A silicon drift detector (SDD) comprising electrically isolated rings. The rings can be individually biased doped rings. One embodiment includes an SDD with a single doped ring. Some of the doped rings may not require a bias voltage. Some of the rings can be field plate rings. The field plate rings may all use the same biasing voltage as a single outer doped ring. The ring widths can vary such that the outermost ring is widest and the ring widths decrease with each subsequent ring towards the anode.

18 Claims, 5 Drawing Sheets

U.S. PATENT DOCUMENTS

2010/0163740 A1    7/2010    Matsuura

FOREIGN PATENT DOCUMENTS

| JP | 2008153255 | 7/2008 |
| JP | 2008258348 | 10/2008 |
| WO | WO 2011002573 | 1/2011 |

OTHER PUBLICATIONS

PCT Application PCT/US2010/037230; filed Jun. 3, 2010; Derek Hullinger; International Search Report mailed Jan. 25, 2011.

Matsurra et al.; Research for Simplifying Structures of Si X-Ray Detectors (Silicon Drift Detector) and Improving Sensitivity of High-Energy X-rays; Dec. 2008; p. 5-10; IEICE Technical Report; The Institute of Electronics, Information and Communication Engineers.

Kitanoya et al.; Simplification of Structures of Si X-ray Detectors (Silicon Drift Detector), Evaluation by Simulation; Dec. 2009; Information and Communication Engineers.

Matsuura et al.; Simplification of Structures and Imporvement of Sensitivity of High-Energy X-Ray Detectors (Silicon Drift Detector); 2010; vol. J93-C No. 9; p. 1-8.

* cited by examiner

VARIABLE RING WIDTH SDD

CLAIM OF PRIORITY

This is a continuation-in-part of U.S. patent application Ser. No. 12/575,939, filed on Oct. 8, 2009; which claims priority of Japan Patent Application Serial No. 2009-157627, filed Jul. 2, 2009; and which claims priority to U.S. Patent Application Ser. Nos. 61/185,679 and 61/185,754, both filed Jun. 10, 2009; which are hereby incorporated herein by reference in their entirety.

FIELD OF THE INVENTION

The present invention relates to silicon drift detectors.

BACKGROUND

Various types of radiation detectors, such as silicon PIN diode detectors or silicon drift detectors, are used for measuring the energy of incoming x-ray photons. A PIN diode can be used for collecting charge carriers that are proportional in number to the energy of the x-ray photon. An example of a PIN diode is illustrated in FIG. 1, shown generally at 10. The PIN diode is comprised of a substrate 12, often referred to as an intrinsic region, an anode 11 on one surface of the substrate, and a cathode 13 on the opposite surface of the substrate. A PIN diode may be used for collection of electron-hole pairs released in response to an x-ray photon. For example, an x-ray photon may interact with an atom in the substrate, resulting in the generation of an electron-hole pair. This initial electron-hole pair may then quickly give rise to a cloud of electron-hole pairs. The electrons can travel to the anode 11 and the holes to the cathode 13. A disadvantage of the PIN diode is the large capacitance due to the large anode size. Such capacitance can result in undesirable electronic noise, resulting in poor resolution.

An example of a silicon drift detector is illustrated in FIG. 2 and shown generally at 20. A silicon drift detector, hereinafter SDD, has a small anode 25 (small relative to a PIN diode anode) at one surface of the substrate 12 and an entrance window layer 26 at the opposite surface of the substrate. Use of a smaller anode results in lower capacitance and thus less undesirable electronic noise, resulting in improved resolution. The anode can be surrounded by multiple doped rings 21. The doped rings are biased in such a way that they result in an electric field which causes electrons to flow towards the anode. The doped rings 21 can have the same doping or conduction type as the entrance window layer 26. The anode 25 can have the same doping or conduction type as the substrate 12, but usually the anode 25 is more highly doped than the substrate 12.

The doped rings 21 can be electrically coupled within the SDD. For example, a MOSFET structure 27 on an SDD is shown in FIG. 3. Conductive contacts 37 can be attached to the doped rings 21. The conductive contacts can be metallic. An insulative layer 38 separates the conductive contacts 37 from the substrate 12. The overlap 39b and c of the conductive contacts 37 over an adjacent doped ring 21 can induce a region of charge carriers 36 in the substrate 12 beneath the insulative layer 38. The charge carriers 36 in this region are of the same type as the majority carriers in the doped rings 21 and thus form a conductive path between the doped rings. For example, as shown in FIG. 3, doped ring 21c is attached to a conductive contact 37c. The conductive contact 37c overlaps an adjacent doped ring 21b at overlap 39c. Due to the conductive contact 37 attachment to one ring and overlap of an adjacent ring, when a voltage is applied across a series of doped rings, the region of charge carriers 36 can be induced in the substrate resulting in a conductive current path between the rings.

The prior art embodiment just described, in which a conductive contact 37, that is attached to one doped ring 21, overlaps an adjacent doped ring, is one method of electrical coupling. Another method of electrical coupling is shown in FIG. 4. A doped region 41, having the same conduction type as the doped rings 21, is created in the surface of the substrate and connects the doped rings 21. Conductive contacts 47 can be attached to the doped rings 21. The doped region 41 provides electrical coupling between the doped rings 21.

As shown in FIG. 2, one voltage bias V1 can be applied to the innermost doped ring that is closest to the anode 25 and another voltage V2 can be applied to the outermost ring. Because the rings are electrically coupled, the voltages at the innermost and outermost rings can create a voltage gradient across all of the rings. Another voltage V3 can be applied to the entrance window layer 26.

The voltage applied to the entrance window layer V3 can be similar in magnitude to the voltage V2 on the outermost ring. The voltage on the innermost ring V1 can have a lower absolute value than the voltage at the outermost ring V2 or at the entrance window V3. Due to the voltage gradient across the rings and the voltage applied to the entrance window 26, the charge carrier can be drawn towards the anode 25. If V2 and V3 are more negative than V1 and V1 is more negative than the anode, then an electron cloud resulting from an impinging x-ray photon can be directed to the anode. Although the prior art SDDs can have reduced electronic noise compared with the prior art PIN diode, such SDDs with electrically coupled rings can be costly to manufacture.

SUMMARY OF THE INVENTION

It has been recognized that it would be advantageous to create a radiation detector having a small anode area for reduced capacitance. It has been recognized that it would be advantageous to create a radiation detector that is relatively less expensive to manufacture.

The present invention is a silicon drift detector comprised of a substrate with a first conduction type. The substrate includes a top surface and a bottom surface. A layer, having a second conduction type, is disposed at the bottom surface of the substrate. An island region having the first conduction type is disposed at the top surface of the substrate. At least two rings can be disposed at the top surface of the substrate and substantially circumscribe the island region. The rings are electrically isolated from each other. Due to the lack of electrical coupling between the rings, the manufacturing cost can be reduced. This invention includes a relatively small anode for reduced capacitance.

DEFINITIONS

Figure 1:
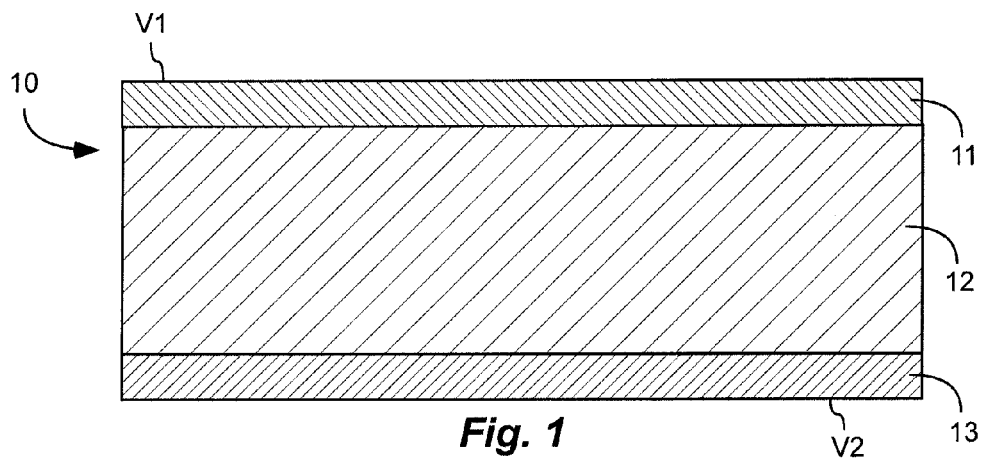
FIG. 1 is a schematic cross-sectional side view of a prior art PIN diode.
Figure 2:
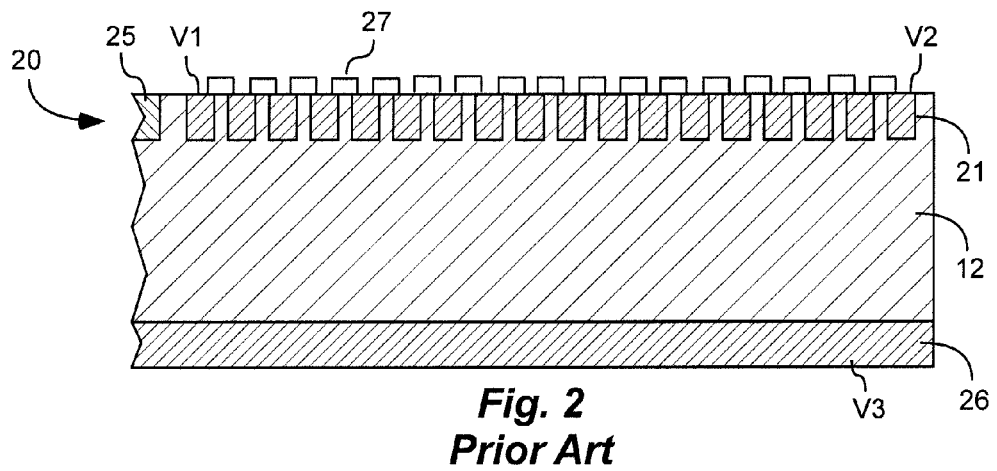
FIG. 2 is a schematic cross-sectional side view of a prior art silicon drift detector.
Figure 3:
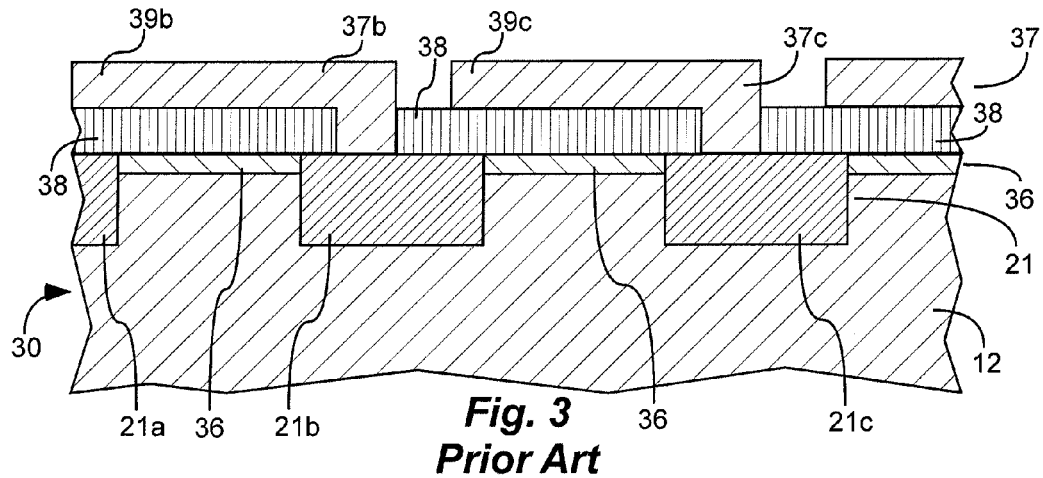
FIG. 3 is a schematic cross-sectional side view of a prior art silicon drift detector.
Figure 4:
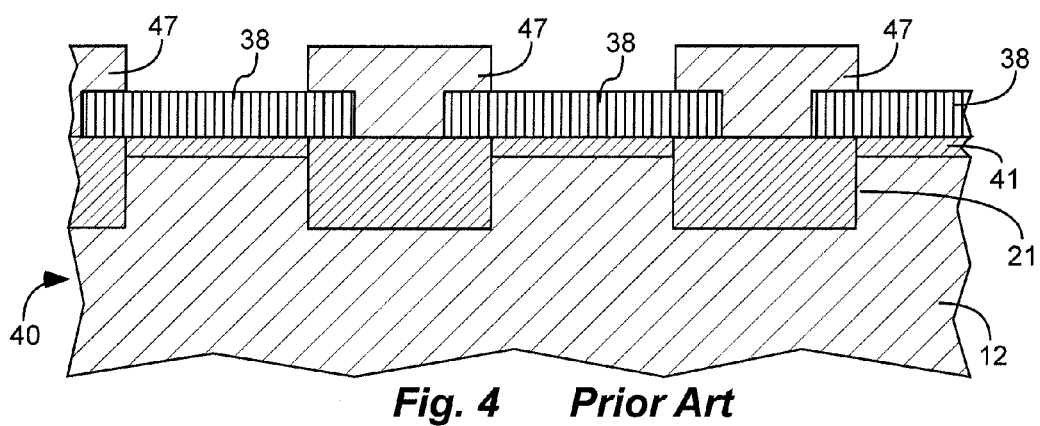
FIG. 4 is a schematic cross-sectional side view of a prior art silicon drift detector.

"Electrically coupled" or "electrical coupling" means that there is an electrical current path, not impeded by an electrical insulator, from one ring to another ring within the SDD. A voltage supply, external to the SDD, may be required to create such electrical coupling.

"Electrically isolated" means that there is no electrical current path from one ring to another ring within the SDD. In other words, electrically isolated rings are separated from each other, within the SDD structure itself, by electrically insulative material, such as an oxide or depleted silicon. There may be a temporary electrical current flow between adjacent electrically isolated materials. For example, if there are three adjacent doped rings separated by silicon of opposite doping type, and two different voltages are applied to the inner and outer rings, initially there may be an electrical current flow towards the unbiased ring in the center. Once a steady-state voltage is reached at this center ring, however, there is no more, or insubstantial, electrical current flow between the rings. This is in contrast to electrically coupled rings in which the electrical current flow can continue.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 5:
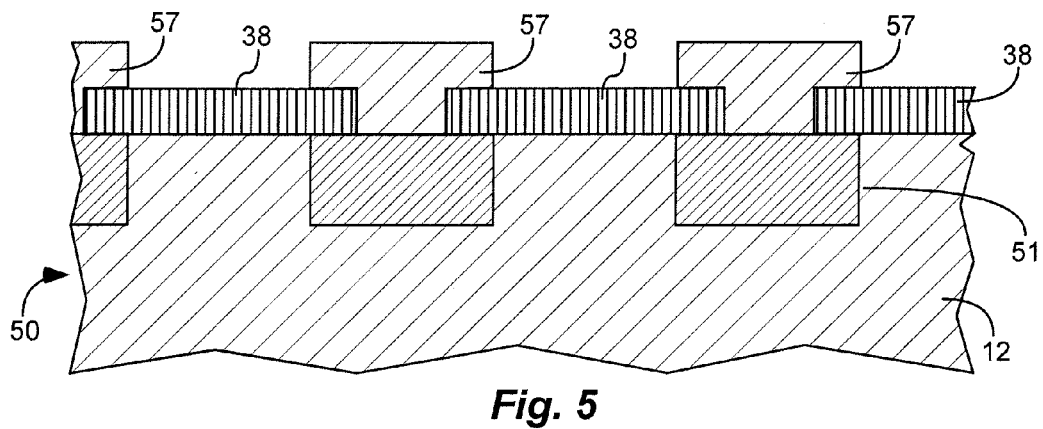
FIG. 5 is a schematic cross-sectional side view of a silicon drift detector in accordance with an embodiment of the present invention.

Referring to FIG. 5, a silicon drift detector (SDD), indicated generally at 50, in accordance with an exemplary embodiment is shown. The SDD includes a substrate 12 having a first conduction type, and with top and bottom surface. The top and bottom surfaces are opposite one another and can be oriented in any direction. A layer 26 (FIGS. 7-9) having a second conduction type can be disposed at the bottom surface of the substrate, and can define an entrance window layer. Typically, the entrance window layer, or bottom surface, faces incoming x-rays. An island region 25 (FIGS. 6-9) having the first conduction type can be disposed at the top surface of the substrate. The island region can be an anode. In addition, the SDD can include at least two rings 51 disposed at the top surface of the substrate and substantially circumscribing the island region. The at least two rings 51 can be doped and are electrically isolated from each other. In another aspect, the SDD can have at least three rings, which can be doped. In another aspect, the SDD can have at least four rings, which can be doped. In another aspect, the SDD can have five rings, which can be doped. In another aspect, the SDD can have one or more field plate rings, as described in greater detail below. There is no overlap of conductive contact 57 over an adjacent doped ring. Also, there is no doped layer in the substrate 12 connecting one doped ring to another doped ring.

Figure 6:
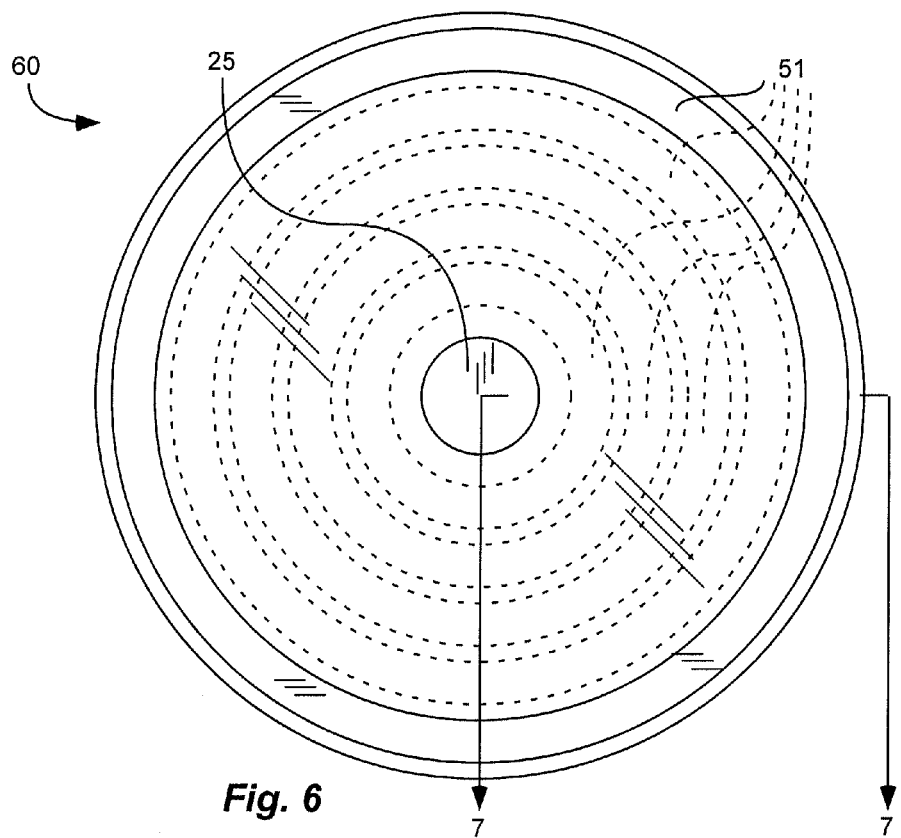
FIG. 6 is a schematic top view of a silicon drift detector in accordance with an embodiment of the present invention.
Figure 7:
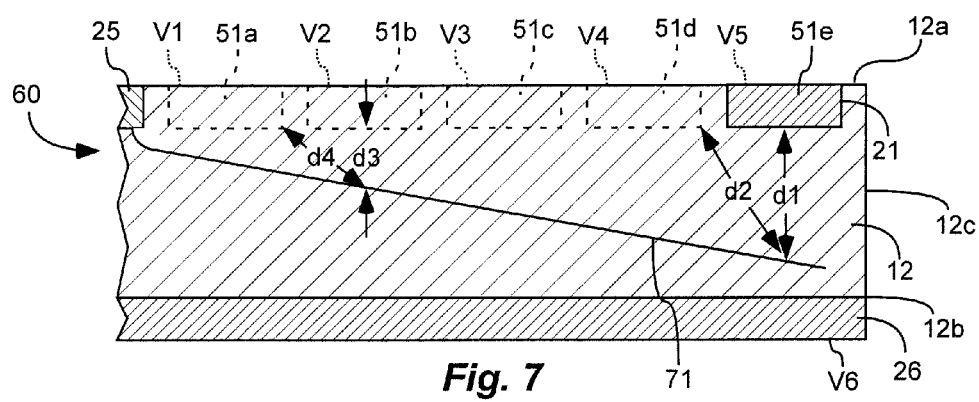
FIG. 7 is a schematic cross-sectional side view of the silicon drift detector of FIG. 6 taken along line 7-7 in FIG. 6.

As illustrated in FIGS. 6 and 7, an SDD shown generally at 60, includes a substrate 12, an entrance window layer 26 at one surface of the substrate 12$b$, and an anode 25 at the opposite surface 12$a$ of the substrate. In one embodiment, a single doped ring 51$e$ circumscribes the anode 25. The single doped ring is situated near the outer perimeter 12$c$ of the SDD. A substantial annular portion of the substrate 12 separates the single doped ring 51$e$ from the anode 25. This embodiment offers the advantage of the need to make only a single doped ring 51$e$ and apply only a single ring voltage V5.

Another embodiment of the present invention, also illustrated in FIGS. 6 and 7, includes additional doped rings 51$a$-$d$. Note that doped rings 51$a$-$d$ are shown with dashed lines as boundary to indicate that they are optional and are not included in the previous embodiment. All rings are electrically isolated from each other. Addition of such additional rings can improve the electron flow to the anode.

Voltages V1-5 can be applied to the rings. It may, however, be desirable, in order to allow for simpler bias voltage circuitry, to apply voltages only to some of the rings and not to other rings. For example, a voltage V5 may be applied only to the outermost ring 51$e$. This outermost voltage V5 can induce a voltage on the inner rings. The voltage can be induced by a temporary flow of current between the outermost ring 51$e$ and the other rings 51$a$-$d$. Because the rings are electrically isolated, once a voltage is induced in the inner rings, the electrical current can stop.

Alternatively voltages may be attached to multiple, but not to all, rings. For example, voltages V1, V3, and V5 may be applied to rings 51$a$, 51$b$, and 51$e$ and no voltages applied to rings 51$b$ and 51$d$. The voltages V1, V3, and V5 applied to rings 51$a$, 51$b$, and 51$e$ can induce a voltage on rings 51$b$ and 51$d$. Although for optimal SDD performance it may be desirable to have a separate bias voltage applied to each individual ring, simpler bias voltage circuitry allowed by fewer rings may dictate that in some circumstances it is better to trade optimal performance for simpler circuitry. Although in FIGS. 6 and 7, an SDD with five doped rings is shown, either more or less rings may be used, depending on design requirements.

The substrate 12 and the anode 25 can be one conduction type and the entrance window 26 and the doped rings can be an opposite conduction type. For example, if it is desirable for electrons to the drawn to the anode, the substrate 12 and the anode 25 can be n doped and the entrance window 26 and the doped rings can be p doped. Normally the anode 25 is more highly doped than the substrate 12. Alternatively, if it is desirable to draw positive charges (i.e., holes) to the anode, then the substrate 12 and the anode 25 can be p doped and the entrance window 26 and the doped rings can be n doped. Either configuration of doping is applicable to all embodiments of this invention. For simplicity, future discussion will describe electrons as the desired charge that is drawn to the anode. It will be appreciated, however, that by reversing the doping and changing the voltages, that positive charges can be drawn to the anode.

Also shown in FIG. 7 is an electron drift path 71. The distance d3, between the electron and the ring 51$b$, when the electron is near the anode 25, is shorter than the distance d1, between the electron and the ring 51$e$, when the electron is near the outer perimeter 12$c$. Due to the relatively larger distance d1, the ratio of distances d2:d1 between the electron and adjacent rings 51d and 51e when an electron is near the outer perimeter 12c is smaller than the ratio of distances d4:d3 between the electron and adjacent rings 51a and 51b when an electron is near the anode 25. As a result of this smaller ratio of distances between the electron and the rings when an electron is near the outer perimeter 12c than the electron is near the anode, the voltage differential between the rings results in a stronger electric drift field directly below a given ring when the electron is nearer the outer perimeter. Therefore, the electron drift speed can decrease when the electron is directly below a ring as the electron nears the anode 25. This decrease in speed results in greater spreading of the electron cloud, which in turn results in poorer resolution at short peaking times due to ballistic deficit.

Figure 8:
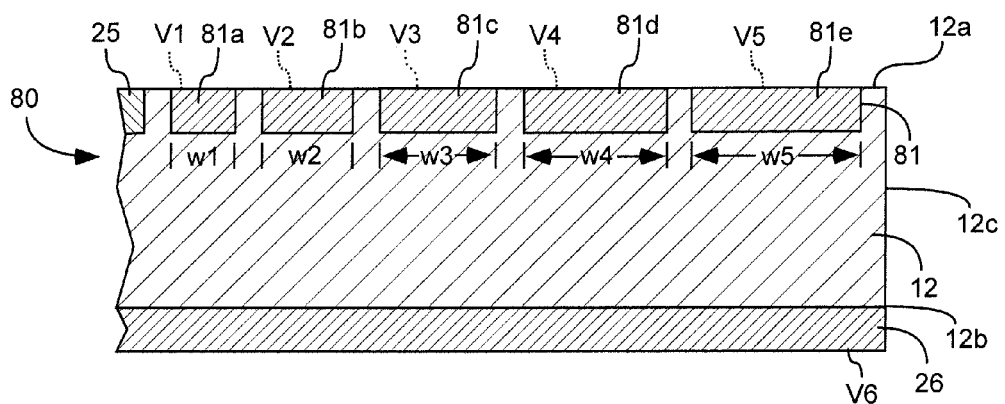
FIG. 8 is a schematic cross-sectional side view of a silicon drift detector in accordance with an embodiment of the present invention.

Electron travel time to the anode can be reduced with variable ring widths. As shown in FIG. 8, the ring width can be widest w5 at the outermost ring 81e. Ring width can decrease with each subsequent ring that is nearer the anode 25 such that the ring width w1 of the innermost ring 81a is the narrowest. Use of narrower rings near the anode can result in similar ratios of distance between the electron and adjacent rings when the electron is near the outer perimeter 12c as when the electron is near the anode 25. As a result, the electron drift speed as it approaches the anode can be more uniform along the entire drift path and the resolution at short peaking times can be improved. The SDD 80, shown in FIG. 8, similar to the SDD 60, shown in FIGS. 6 and 7, can have more or less rings than the five rings shown and bias voltages can be applied to one, some, or all of the rings.

Figure 9:
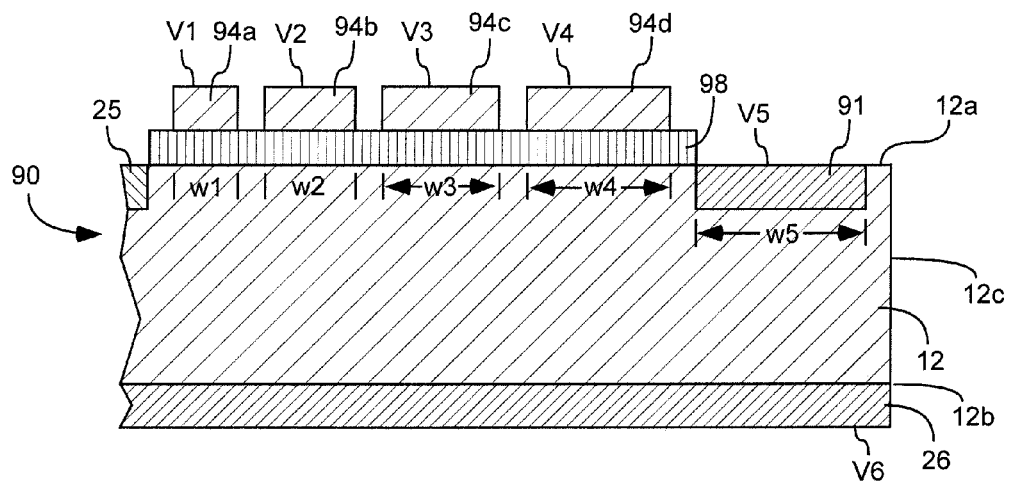
FIG. 9 is a schematic cross-sectional side view of a silicon drift detector in accordance with an embodiment of the present invention.

As shown in FIG. 9, and indicated generally by 90, an SDD may be made with field plate rings 94a-d in addition to at least one outer doped ring 91. Field plate rings can be electrically isolated from each other. Field plate rings, unlike a doped ring, can be electrically isolated from the substrate by an insulating layer 98, such as an oxide layer. Each field plate ring 94a-d can be individually biased V1-4.

An advantage of the field plate rings is that SDD performance with a single bias voltage for all field plate rings and the doped ring can be comparable to the performance realized with multiple bias voltages, thus allowing good performance with a single bias voltage. Use of a single bias voltage allows simpler circuitry in the bias voltage supply. A single bias voltage can be used because the insulating layer between the field plate ring and the substrate results in an inversion layer in the silicon adjacent to the insulative layer. As a result of this inversion layer, and the effect of the voltage V5 on the outer doped ring 91, once a high enough bias voltage on the field plate ring is obtained, any higher voltages merely result in a greater voltage drop through the insulating layer, but the voltage on the substrate side of the insulating layer remains substantially unchanged. For example, in the SDD 90 of FIG. 9, use of voltages V1=−20 volts, V2=−40 volts, V3=−60, V4=−80, and V5=−100 can result in comparable SDD performance as would be obtained by use of a single bias voltage of V5=V4=V3=V2=V1=100 volts.

Although four field plate rings 94a-d are shown in FIG. 9, the actual number of field plate rings may be more or less than four. Although one doped ring 91 is shown in FIG. 9, there may be additional doped rings. Also, as discussed above regarding SDD 80, electron drift speed towards the anode 25 may be improved by creating the widest ring at the outer perimeter 12c and using gradually decreasing ring widths towards the center.

Figure 10:
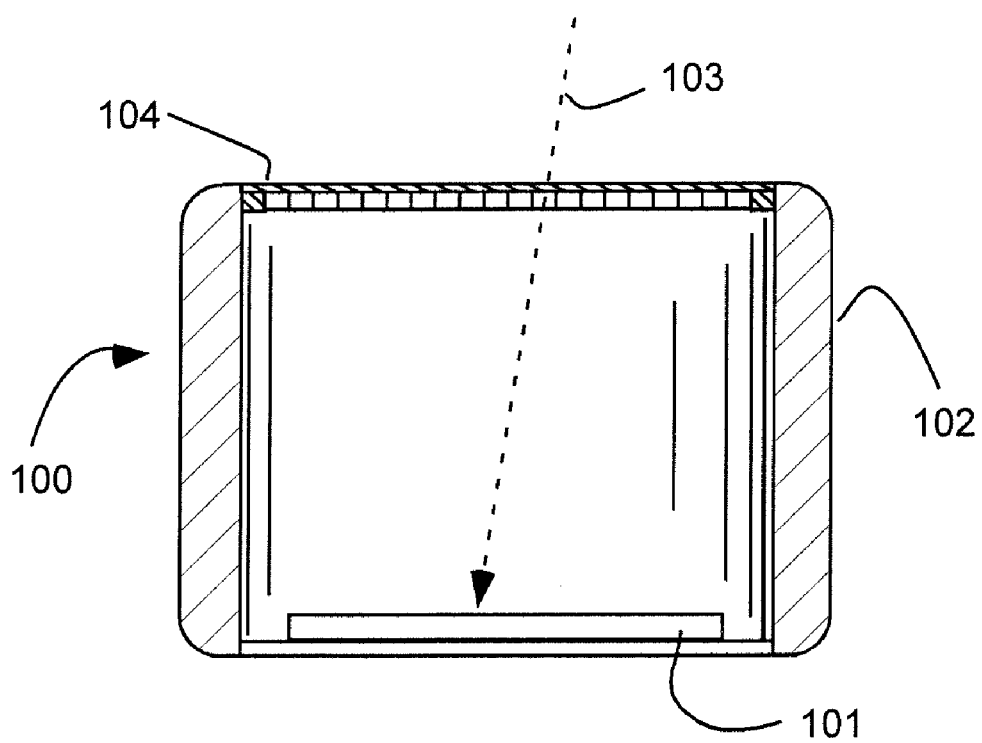
FIG. 10 is a schematic cross-sectional side view of a radiation detection system in accordance with an embodiment of the present invention utilizing the SDD of FIGS. 5-9.

Referring to FIG. 10, the above described various embodiments of silicon drift detectors can be utilized with a radiation detection system 100. The radiation detection system can include an SDD 101. The SDD 101 can be any previously described SDD embodiment. A hermetically sealed container 102 can surround the SDD 101. A window 104 in the container 102 can allow x-rays, represented by line 103, to pass into the container and impinge upon the silicon drift detector 101.

How to Make

The SDD can be made by standard semiconductor manufacturing processes and can be made of standard semiconductor materials such as silicon, germanium, gallium arsenide, etc. The dopants can be standard doping materials. For example, boron or boron difluoride may be used for p type doping and phosphorous or arsenic may be used for n type doping.

Doped rings can be made by masking off desired areas of the substrate with a photoresistive mask and doping the rings by a standard method such as ion implantation. The anode can be created by a similar method. To form the field plate rings, an insulating layer can be added on top of the substrate by any suitable method such as thermal oxidation. A mask can then be applied and the oxide etched away in regions where it is not desired by any suitable method, such as a wet etch. The desired conductive material for the field plate rings can be sputtered onto the surface, followed by the application of a mask and the etching away of the conductive material from undesired regions by a suitable means, such as a wet etch. The field plate rings can be made of an electrically conductive material. For example, the field plate rings may be metallic or a metallic alloy.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

What is claimed is:

1. A silicon drift detector device, comprising:
   a) a substrate having a first conduction type and including a top surface and a bottom surface;
   b) a layer having a second conduction type disposed at the bottom surface of the substrate;
   c) an island region having the first conduction type disposed at the top surface of the substrate;
   d) at least two rings disposed at the top surface of the substrate and substantially circumscribing the island region;
   e) the at least two rings are electrically isolated from each other; and
   f) wherein only an outermost ring is connected to a voltage source.

2. A device as in claim 1, wherein the island region is doped substantially more than the substrate.

3. A device as in claim 1, wherein the at least two rings comprise at least three doped rings.

4. A device as in claim 1, wherein the first conduction type is n doped and the second conduction type is p doped.

5. A device as in claim 1, wherein the first conduction type is p doped and the second conduction type is n doped.

6. A device as in claim 1, further comprising an insulating layer between at least one of the at least two rings and the top surface of the substrate.

7. A silicon drift detector device, comprising:
a) a substrate having a first conduction type and including a top surface and a bottom surface;
b) a layer having a second conduction type disposed at the bottom surface of the substrate;
c) an island region having the first conduction type disposed at the top surface of the substrate;
d) the island region is doped substantially more than the substrate;
e) at least three doped rings concentrically disposed at the top surface of the substrate and substantially circumscribing the island region; and f) a doped ring nearest an outer perimeter of the device is wider than a doped ring that is closest to the island region and no doped ring is wider than an adjacent ring that is nearer the outer perimeter of the device.

8. A device as in claim 7, further comprising a hermetically sealed container surrounding the silicon drift detector device and a widow in the container configured to allow x-rays to pass into the container and impinge upon the silicon drift detector.

9. A silicon drift detector device, comprising:
a) a substrate having a first conduction type and including a top surface and a bottom surface;
b) a layer having a second conduction type disposed at the bottom surface of the substrate;
c) an island region having the first conduction type disposed at the top surface of the substrate;
d) the island region is doped substantially more than the substrate;
e) at least three field plate rings concentrically disposed at the top surface of the substrate, electrically isolated from the substrate, and substantially circumscribing the island region;
f) at least one doped ring disposed at the top surface of the substrate and substantially circumscribing the at least three field plate rings;
g) a width of a field plate ring nearest an outer perimeter of the device is narrower than a width of the at least one doped ring but wider than any other field plate ring; and
b) a width of each successive field plate ring closer to the island region is narrower than a width of an adjacent field plate ring that is nearer the outer perimeter of the device.

10. A device as in claim 9, further comprising a hermetically sealed container surrounding the silicon drift detector device and a window in the container configured to allow x-rays to pass into the container and impinge upon the silicon drift detector.

11. A silicon drift detector device, comprising:
a) a substrate having a first conduction type and including a top surface and a bottom surface;
b) a layer having a second conduction type disposed at the bottom surface of the substrate;
c) an island region having the first conduction type disposed at the top surface of the substrate;
d) at least four rings disposed at the top surface of the substrate and substantially circumscribing the island region;
e) the at least four rings are electrically isolated from each other; and
f) a width of a ring nearest the outer perimeter of the device is widest and a width of each successive ring closer to the island region is narrower than a width of an adjacent outer ring.

12. A device as in claim 11, wherein at least two rings are not connected to a voltage source.

13. A device as in claim 11, wherein:
a) the at least four rings comprise at least five rings;
b) at least three of the at least five rings are connected to a voltage source;
c) a voltage of an outermost ring has a largest absolute value voltage; and
d) a voltage at each successive ring closer to the island region has a lower absolute value voltage than a voltage of an adjacent outer ring.

14. A device as in claim 11, further comprising a hermetically sealed container surrounding the silicon drift detector device and a window in the container configured to allow x-rays to pass into the container and impinge upon the silicon drift detector.

15. A silicon drift detector device, comprising:
a) a substrate having a first conduction type and including a top surface and a bottom surface;
b) a layer having a second conduction type disposed at the bottom surface of the substrate;
c) an island region having the first conduction type disposed at the top surface of the substrate;
d) at least two rings disposed at the top surface of the substrate and substantially circumscribing the island region;
e) the at least two rings are electrically isolated from each other
f) the at least two rings include at least one doped ring;
g) at least one of the at least two rings is a field plate ring which is electrically isolated from the substrate; and
h) the at least one field plate ring is closer to the island region than the doped ring.

16. A device as in claim 15, wherein:
a) the at least one field plate ring comprises at least three field plate rings which are electrically isolated from the substrate;
b) the at least three field plate rings are each connected to a voltage source;
c) a voltage of a field plate ring nearest an outer perimeter of the device has a lower absolute value than the at least one doped ring but a higher absolute value than any other field plate ring;
d) a voltage at each successive field plate ring closer to the island region is a lower absolute value than a voltage of an adjacent field plate ring that is nearer the outer perimeter of the device;
e) a width of the field plate ring nearest the outer perimeter of the device is narrower than a width of the at least one doped ring but wider than any other field plate ring; and
f) a width of each successive field plate ring closer to the island region is narrower than a width of the adjacent field plate ring that is nearer the outer perimeter of the device.

17. A device as in claim 15, wherein:
a) the at least one field plate ring comprises at least three field plate rings; and
b) the at least three field plate rings and the at least one doped ring are each connected to a voltage source having substantially the same value for all rings.

18. A device as in claim 15, wherein:
a) a width of a field plate ring nearest the outer perimeter of the device is narrower than a width of the at least one doped ring but wider than any other field plate ring; and
b) a width of each successive field plate ring closer to the island region is narrower than a width of the adjacent field plate ring that is nearer the outer perimeter of the device.

* * * * *